United States Patent
Wataru (10) Patent No.: US 9,563,493 B2
(45) Date of Patent: *Feb. 7, 2017

(54) LOAD-CONTROL BACKUP SIGNAL GENERATION CIRCUIT

(71) Applicant: Yazaki Corporation, Tokyo (JP)

(72) Inventor: Kazuhisa Wataru, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 75 days.

This patent is subject to a terminal disclaimer.

(21) Appl. No.: 14/622,342

(22) Filed: Feb. 13, 2015

(65) Prior Publication Data

US 2015/0234697 A1    Aug. 20, 2015

(30) Foreign Application Priority Data

Feb. 17, 2014 (JP) .................................. 2014-027592

(51) Int. Cl.
*G06F 11/07* (2006.01)
*G01R 31/00* (2006.01)
*G06F 11/16* (2006.01)

(52) U.S. Cl.
CPC .......... *G06F 11/0757* (2013.01); *G01R 31/00* (2013.01); *G06F 11/0739* (2013.01); *G06F 11/0772* (2013.01); *G06F 11/1604* (2013.01)

(58) Field of Classification Search
CPC .............. G06F 11/0757; G06F 11/0739; G06F 11/0772; G01R 31/00; B60W 50/02
See application file for complete search history.

(56) References Cited

U.S. PATENT DOCUMENTS

| 4,910,496 A * | 3/1990 | Hatanaka | B60Q 11/007 307/10.8 |
| 5,528,756 A * | 6/1996 | Molnar | G06F 11/0754 714/55 |
| 6,952,785 B1 * | 10/2005 | Diab | G06F 1/26 370/244 |
| 8,996,927 B2 * | 3/2015 | Yoshikawa | G06F 11/0757 714/55 |
| 2010/0004811 A1 | 1/2010 | Kannan et al. | |

FOREIGN PATENT DOCUMENTS

| JP | 2010-13988 A | 1/2010 |
| JP | 2011-098593 A | 5/2011 |

* cited by examiner

*Primary Examiner* — Bryce Bonzo
*Assistant Examiner* — Jonathan Gibson
(74) *Attorney, Agent, or Firm* — Sughrue Mion, PLLC (57) ABSTRACT

In a case in which a malfunction occurs in a control processor which operates according to a predetermined program, a load-control backup signal generation circuit supplies a backup control signal to a switch of a load connected to an output of the control processor. The load-control backup signal generation circuit includes: a watchdog input terminal to which a watchdog signal periodically output from the control processor is input; a pulse count unit which counts a clock pulse generated with a constant period and which controls a count state of the clock pulse according to a signal input to the watchdog input terminal; and a backup signal output unit which generates the backup control signal when a count output of the pulse count unit satisfies a predetermined condition.

5 Claims, 6 Drawing Sheets

LOAD-CONTROL BACKUP SIGNAL GENERATION CIRCUIT

CROSS REFERENCE TO RELATED APPLICATION(S)

This application is based on and claims priority from Japanese Patent Application (Application No. 2014-027592) filed on Feb. 17, 2014, the entire contents of which are incorporated herein by reference.

BACKGROUND

1. Field of the Invention

One or more aspects of the present invention relate to a load-control backup signal generation circuit which supplies a backup control signal to a load switch connected to an output of a control processor, in a case in which a malfunction occurs in the control processor which operates according to a predetermined program.

2. Description of the Related Art

For example, a microprocessor for control which operates according to a predetermined program, that is, a microcomputer (control processing unit) (CPU) is embedded in various electronic control units (ECU) that are mounted in a vehicle.

The microcomputer generally performs various controls according to the content of a program that is prepared in advance, as scheduled. However, for example, in a case of being influenced by electromagnetic noise entering from the outside, a case in which a microcomputer fails, a case in which an unexpected operation is performed due to the influence of defects (bug) included in a program itself, or the like, the microcomputer can be in a runaway state.

If the microcomputer is in a runaway state, the entire electronic control device is in an uncontrollable state. Thus, a system of various electronic control devices monitors whether or not a malfunction occurs in the microcomputer, and in a case in which an occurrence of a malfunction is detected, it is necessary to return the microcomputer to a normal state.

For this reason, various electronic control devices of the related art control in such a manner that the microcomputer periodically outputs a pulse called a watchdog signal to the outside. Then, a monitoring circuit is connected to the outside of the microcomputer, and the monitoring circuit constantly monitors a watchdog signal that is output from the microcomputer. If a malfunction occurs in the microcomputer, the watchdog signal no longer appears. If the monitoring circuit detects a state where the watchdog signal does not periodically appear, an operation of the microcomputer is initialized.

Figure 1:
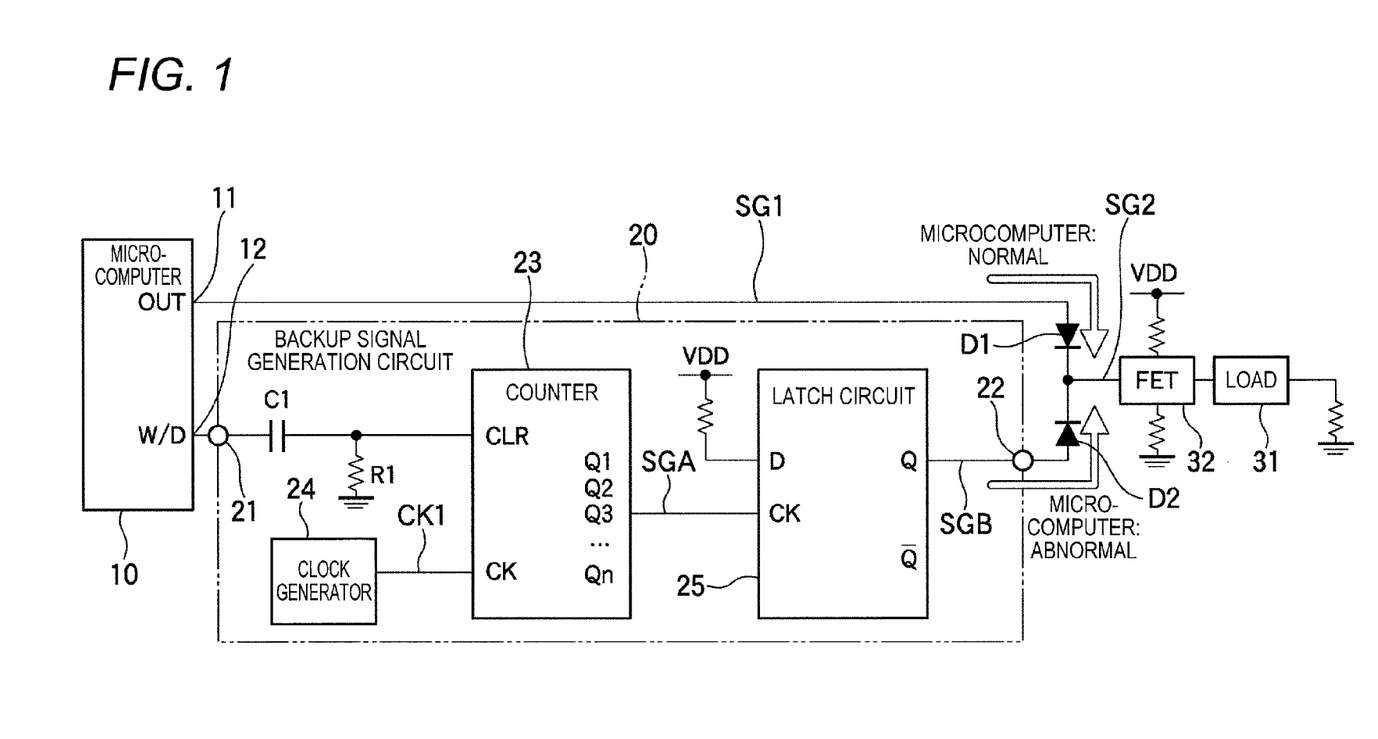
FIG. 1 is an electric circuit diagram illustrating a configuration example of a main unit of an electronic control device including a backup signal generation circuit according to an embodiment.

In an in-vehicle electronic control device described in JP-A-2010-13988, if runaway of a main CPU 10 illustrated in FIG. 1 occurs and a pulse width of the watchdog signal WDS becomes excessive, a power supply control circuit 113 detects this and generates a reset pulse signal RST.

In addition, also in an electronic control system for vehicle described in JP-A-2011-98593, a watchdog timer 24 that is embedded in a power supply control IC 23 monitors an operational state of a CPU 1 based on a watchdog signal that is transmitted from the CPU 1, and when a malfunction occurs, transmits the reset pulse signal RST.

SUMMARY

As described in JP-A-2010-13988 and JP-A-2011-98593, a watchdog signal that is output from a microcomputer is monitored, and thereby it is possible to detect a malfunction of an operation of the microcomputer. In addition, a circuit that monitors the watchdog signal provides a reset signal for the microcomputer if a malfunction is detected. If the reset signal is provided, as is the case in turn-on of power, the microcomputer initializes a state of hardware and restarts an execution of a program from a head position.

Thus, for example, in a case in which runaway of the microcomputer is caused by temporary factors, such as input of electromagnetic noise, it is possible to return the operation of the microcomputer to a normal state by providing a reset signal.

However, in a case in which a continuous malfunction occurs in the microcomputer, it is not possible to return the operation of the microcomputer to a normal state even by providing a reset signal. In addition, in a case in which a malfunction of the microcomputer occurs in an electronic control device that controls an on-off of energizing of a load, it is not possible to perform the on-off of energizing of the load, even in a case in which a circuit that monitors a watchdog signal is mounted.

For this reason, in an in-vehicle electronic control device or the like, in preparation for a case in which a malfunction of the microcomputer occurs, it is desirable that a circuit for backup is mounted. That is, a circuit that generates a backup control signal for controlling the load instead of the microcomputer is necessary, in such a manner that the on-off of energizing of the load can be performed even in a case in which a microcomputer malfunctions.

Figure 4:
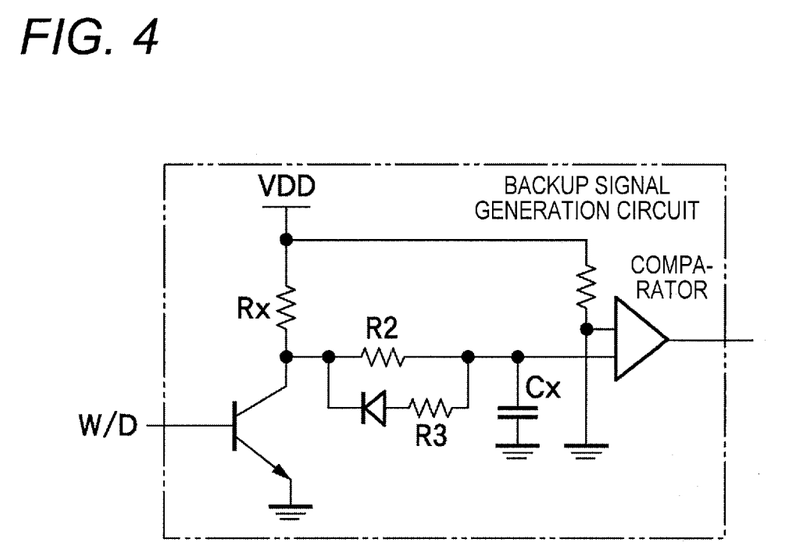
FIG. 4 is an electric circuit diagram illustrating a configuration example of a backup signal generation circuit.

The circuit that generates such a backup control signal can be configured using an analog circuit illustrated in, for example, FIG. 4. The analog circuit includes a time constant circuit that is configured by a capacitor Cx and a resistor Rx, and an analog comparator that compares voltages.

Figure 5:
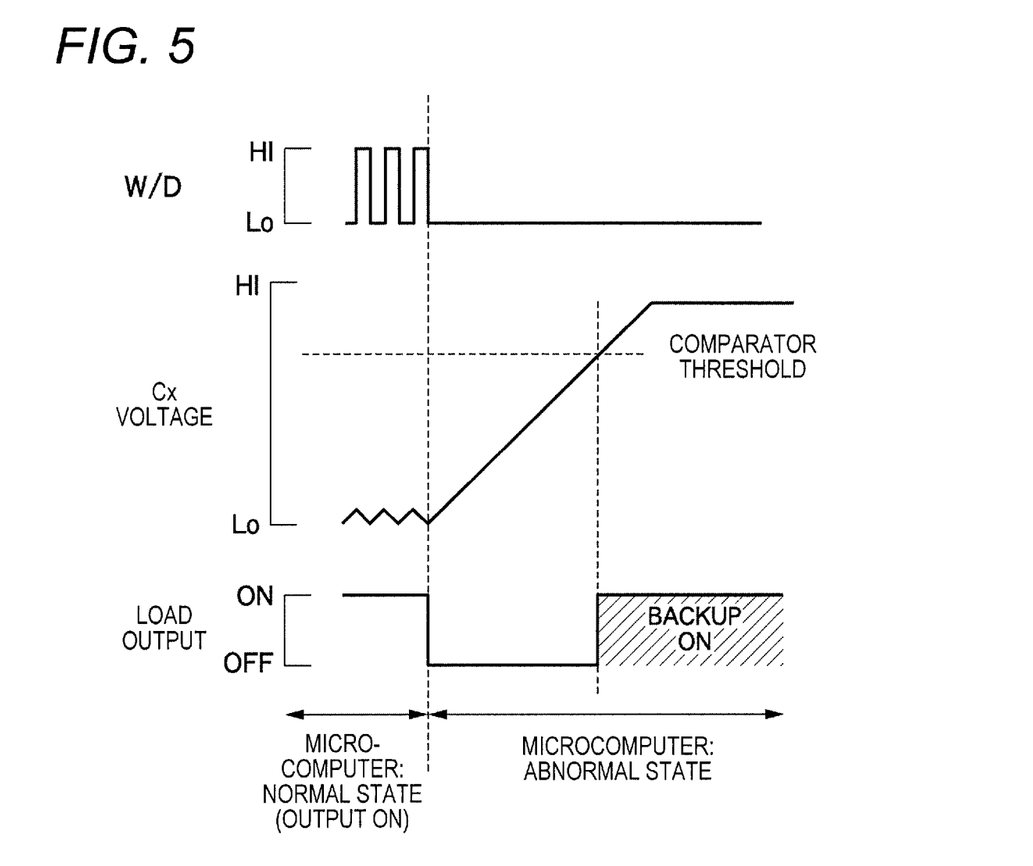
FIG. 5 is a timing chart illustrating an operation example of the backup signal generation circuit illustrated in FIG. 4, when a malfunction occurs.

In the circuit in FIG. 4, if a pulse of a watchdog signal W/D that is output from the microcomputer is stopped, a voltage of the capacitor Cx increases according to a time constant with the elapse of time, as illustrated in FIG. 5, and if a predetermine time elapses, a voltage of the capacitor Cx reaches a threshold, and thus an output signal of the analog comparator is inverted. It is possible to use the output signal of the analog comparator as the backup control signal for an on-off of energizing control of the load.

However, there are following problems in the case in which the circuit illustrated in FIG. 4 is used.

(1) Since variation of the characteristics (capacitance) of the capacitor Cx is relatively great, variation of a CR time constant circuit is also increased. Thus, in a case in which an electronic control device including the circuit is mass-produced, a sufficient margin when designing is forced to be taken by taking into account the variation of a time constant due to individual differences. For this reason, it takes a time from when a malfunction occurs in the microcomputer until when a backup control signal is actually output, and the time required until when a backup control system can control the load increases.

Figure 6:
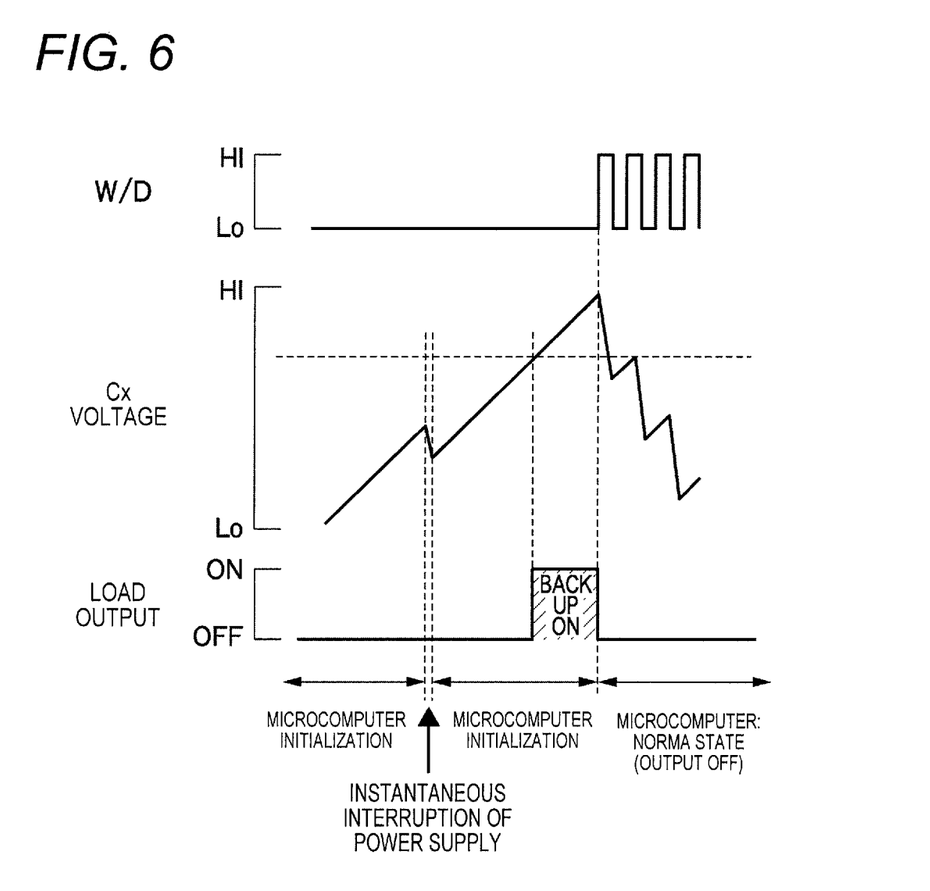
FIG. 6 is a timing chart illustrating an operational example of the backup signal generation circuit illustrated in FIG. 4, when an instantaneous interruption occurs.

(2) When the power is turned on or a reset signal is input, the microcomputer performs processing of initialization that is determined in advance, and starts a pulse output of the watchdog signal W/D after the processing has been completed. Thus, with regard to a circuit (for example, the circuit in FIG. 4) that monitors the pulse of the watchdog signal W/D, a time constant is determined in such a manner that even if the pulse of the watchdog signal W/D does not appear in an initialization time zone, it is not judged to be a malfunction caused by a mistake. However, with regard to the power supply that is supplied to the electronic control device or the like, there is a case in which an instantaneous interruption occurs due to various factors. Then, if the instantaneous interruption of a power supply occurs when the microcomputer performs the processing of initialization, a power supply circuit generates a reset signal, and the microcomputer restarts the processing of initialization from the beginning. In this case, the time required for the processing of initialization to be completed becomes longer than usual. According to this, the time required until the pulse generation of the watchdog signal W/D is started becomes long. Meanwhile, in the circuit of FIG. 4, when the instantaneous interruption of the power supply occurs, the charges of the capacitor Cx are discharged, but in a case in which the time of the instantaneous interruption is significantly short, the charges are insufficiently discharged. As a result, as illustrated in FIG. 6, before the microcomputer completes the processing of initialization, a voltage of the capacitor Cx reaches a threshold. Thus, despite a malfunction not actually occurring in the microcomputer, a backup control system starts an operation by mistake.

One or more aspects of the present invention have been made in view of the above circumstances, and an object thereof is to provide a load-control backup signal generation circuit which can output a backup control signal for controlling a load in a short period of time, and can prevent a malfunction caused by an instantaneous interruption of a power supply, in a case in which a malfunction occurs in a microcomputer.

A load-control backup signal generation circuit according to one or more embodiments of the present invention described above will be briefly described in the following items (1) to (4).

(1) A load-control backup signal generation circuit which, in a case in which a malfunction occurs in a control processor which operates according to a predetermined program, supplies a backup control signal to a switch of a load connected to an output of the control processor, the load-control backup signal generation circuit including:

a watchdog input terminal to which a watchdog signal periodically output from the control processor is input;

a pulse count unit which counts a clock pulse generated with a constant period and which controls a count state of the clock pulse according to a signal input to the watchdog input terminal; and a backup signal output unit which generates the backup control signal when a count output of the pulse count unit satisfies a predetermined condition.

(2) The load-control backup signal generation circuit as described in the item (1), further including:

a DC-cut capacitor connected between the watchdog input terminal and a control input terminal of the pulse count unit; and a potential-control resistor connected between the control input terminal of the pulse count unit and a power supply line having a predetermined potential.

(3) The load-control backup signal generation circuit as described in the item (1) or (2), further including a clock pulse generator which generates the clock pulse with the constant period.

(4) The load-control backup signal generation circuit as described in any one of the items (1) to (3), wherein the backup signal output unit retains a state of the generated backup control signal in the latch circuit, when the count output of the pulse count unit satisfies the predetermined condition.

According to the load-control backup signal generation circuit described in the configuration of (1), even in a case in which an instantaneous interruption occurs in a power supply, it is possible for a pulse count unit to correctly detect a length of time when a pulse does not appear in a watchdog signal. In addition, since the load-control backup signal generation circuit is less likely to be affected by variation of characteristics of a component such as a capacitor, it is possible to reduce a margin at the time of designing. Accordingly, it is possible to output a backup control signal in a short period of time in a case in which a control processor, that is, a microcomputer malfunctions.

According to the load-control backup signal generation circuit described in the configuration of (2), when a pulse does not appear in the watchdog signal, it is possible to fix a control input terminal of the pulse count unit to a predetermined position, and to prevent the occurrence of the malfunction.

According to the load-control backup signal generation circuit described in the configuration of (3), since the clock pulse generator is embedded, it is not necessary to supply the clock pulse from the outside. Thus, it is possible to be used even in circumstances for an in-vehicle apparatus.

According to the load-control backup signal generation circuit described in the configuration of (4), as in a case in which a control processor malfunctions, since a level of the backup control signal is constantly maintained, it is possible to control the on-off of energizing of the load using the backup control signal.

According to a load-control backup signal generation circuit of one or more aspects of the present invention, in a case in which a malfunction occurs in a microcomputer, it is possible to output a backup control signal for controlling a load in a short period of time, and to prevent a malfunction caused by an instantaneous interruption of a power supply.

As described above, one or more aspects of the present invention are briefly described. Furthermore, by reading through a form (hereinafter, referred to as "embodiment") for performing an invention that will be described hereinafter, with reference to the attached drawings, details of one or more embodiments of the present invention will be further clarified.

DETAILED DESCRIPTION

A specific embodiment with regard to a load-control backup signal generation circuit according to embodiments of the present invention will be described hereinafter with reference to each drawing.

<Description of Configuration Example>

FIG. 1 illustrates a configuration example of a main unit of an electronic control device including a backup signal generation circuit 20 according to the present embodiment.

An electronic control device illustrated in FIG. 1 includes a microcomputer 10 as a main control unit. The microcomputer 10 executes a program that is stored in advance in, for example, an inner memory (ROM), and thereby it is possible to perform a control for performing a function necessary for the electronic control device.

In the configuration example illustrated in FIG. 1, the microcomputer 10 has a function to control an on-off of energizing of a load 31. As a specific example of the load 31, various in-vehicle electrical components can be assumed. In addition, a switching device 32 that is configured with a power FET controls an on-off of energizing of the load 31, according to a level of a energizing control signal SG2 that is a binary signal.

The energizing control signal SG2 for controlling the load 31 is generally changed depending on a normal system control signal SG1 that is controlled by processing of the microcomputer 10. However, there is a case in which a continuous malfunction occurs in the microcomputer 10. If the microcomputer 10 malfunctions, the normal system control signal SG1 is not changed, it enters a state where the on-off control of the load 31 cannot be controlled.

The backup signal generation circuit 20 is mounted as a backup in a case in which the microcomputer 10 malfunctions (in abnormal state). That is, when the normal system control signal SG1 is not changed, a backup control signal SGB that is output from the backup signal generation circuit 20 controls the load 31 instead of the microcomputer 10.

In order to prevent a reverse flow of a signal, a diode D1 is connected between an output port 11 of the microcomputer 10 and a control input of a switching device 32, and a diode D2 is connected between a backup control signal output terminal 22 of the backup signal generation circuit 20 and the control input of the switching device 32.

During the normal operation of the microcomputer 10, a pulse of a watchdog signal W/D periodically appears in a watchdog signal output port 12 of the microcomputer 10. While the microcomputer 10 performs processing of initialization, it is not possible to output the watchdog signal W/D. In a case in which a program causes a configuration of the microcomputer 10 to runaway, the pulse of the watchdog signal W/D is stopped. Furthermore, in a case in which the microcomputer 10 malfunctions, the pulse of the watchdog signal W/D is stopped, and a potential of the watchdog signal output port 12 enters an uncertain state.

As illustrated in FIG. 1, a watchdog input terminal 21 of the backup signal generation circuit 20 is connected to the watchdog signal output port 12 of the microcomputer 10. That is, the backup signal generation circuit 20 monitors the pulse of the watchdog signal W/D, and generates the backup control signal SGB, when a state of the watchdog signal W/D satisfies a predetermined condition.

The backup signal generation circuit 20 illustrated in FIG. 1 includes a watchdog input terminal 21, a backup control signal output terminal 22, a capacitor C1, a resistor R1, a counter 23, a clock generator 24, and a latch circuit 25.

The clock generator 24 includes a predetermined oscillation circuit, and constantly outputs a clock pulse CK1 with a constant period.

The counter 23 includes a clock pulse input terminal CK, a clear control terminal CLR, and count output terminals Q1, Q2, Q3, . . . , Qn of n bits. A clock pulse CK1 that is output from the clock generator 24 is applied to the clock pulse input terminal CK.

A clear control terminal CLR of the counter 23 is connected to the watchdog input terminal 21 via a capacitor C1, and is further grounded via a resistor R1. The capacitor C1 is provided to block DC components of an input signal. In addition, when the pulse does not appear in the watchdog signal W/D, the resistor R1 has a function that makes a potential of the clear control terminal CLR quickly approach a desired potential.

The latch circuit 25 is configured by a D type flip flop (D-FF). When the count outputs of the counter 23 satisfy a predetermined condition, the latch circuit 25 generates the backup control signal SGB, and has a function to retain the signal level.

A D input terminal of the latch circuit 25 is pulled up to a power supply line (VDD). In addition, in the example of FIG. 1, a clock pulse input terminal CK of the latch circuit 25 is connected to the count output terminal Q3 of the third bit of the counter 23. The output terminal of the latch circuit 25 is connected to the backup control signal output terminal 22.

<Explanation of Operation>

Figure 2:
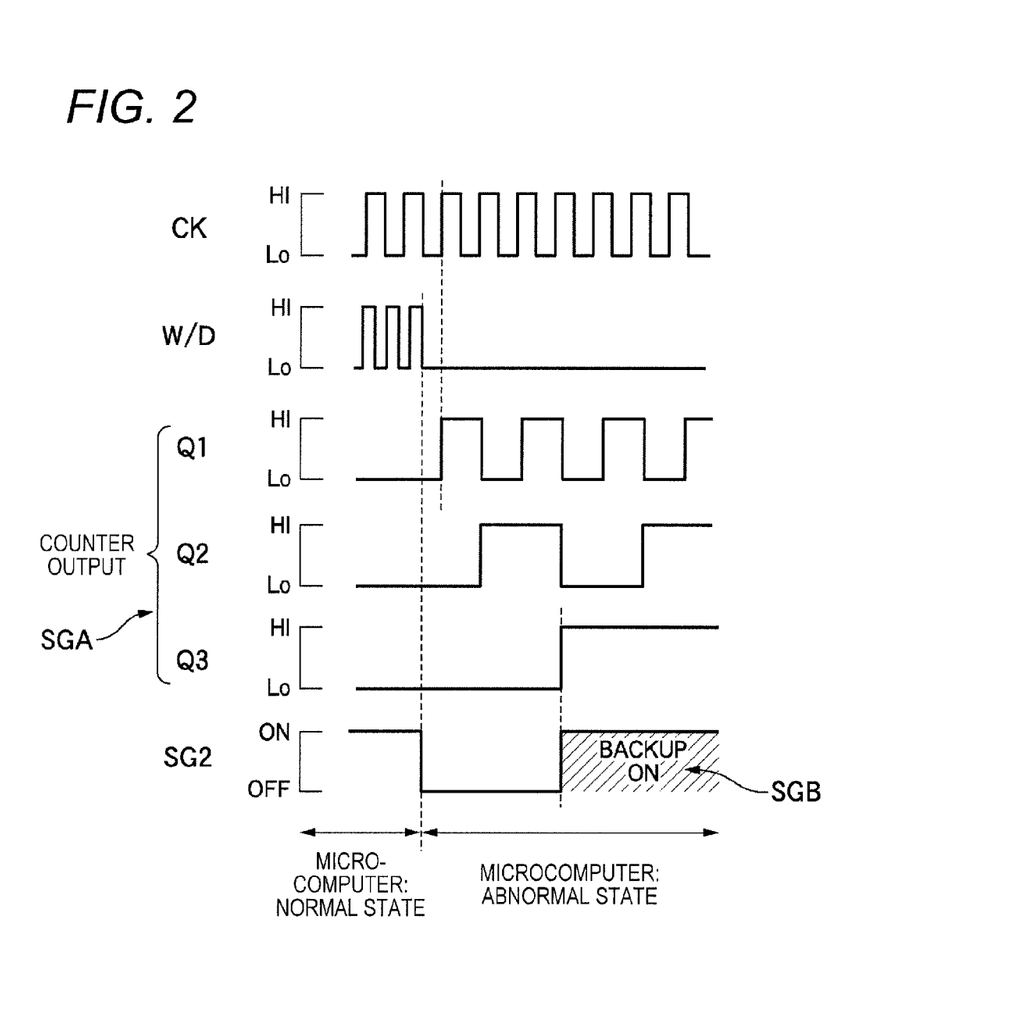
FIG. 2 is a timing chart illustrating an operation example of the backup signal generation circuit illustrated in FIG. 1.
Figure 3:
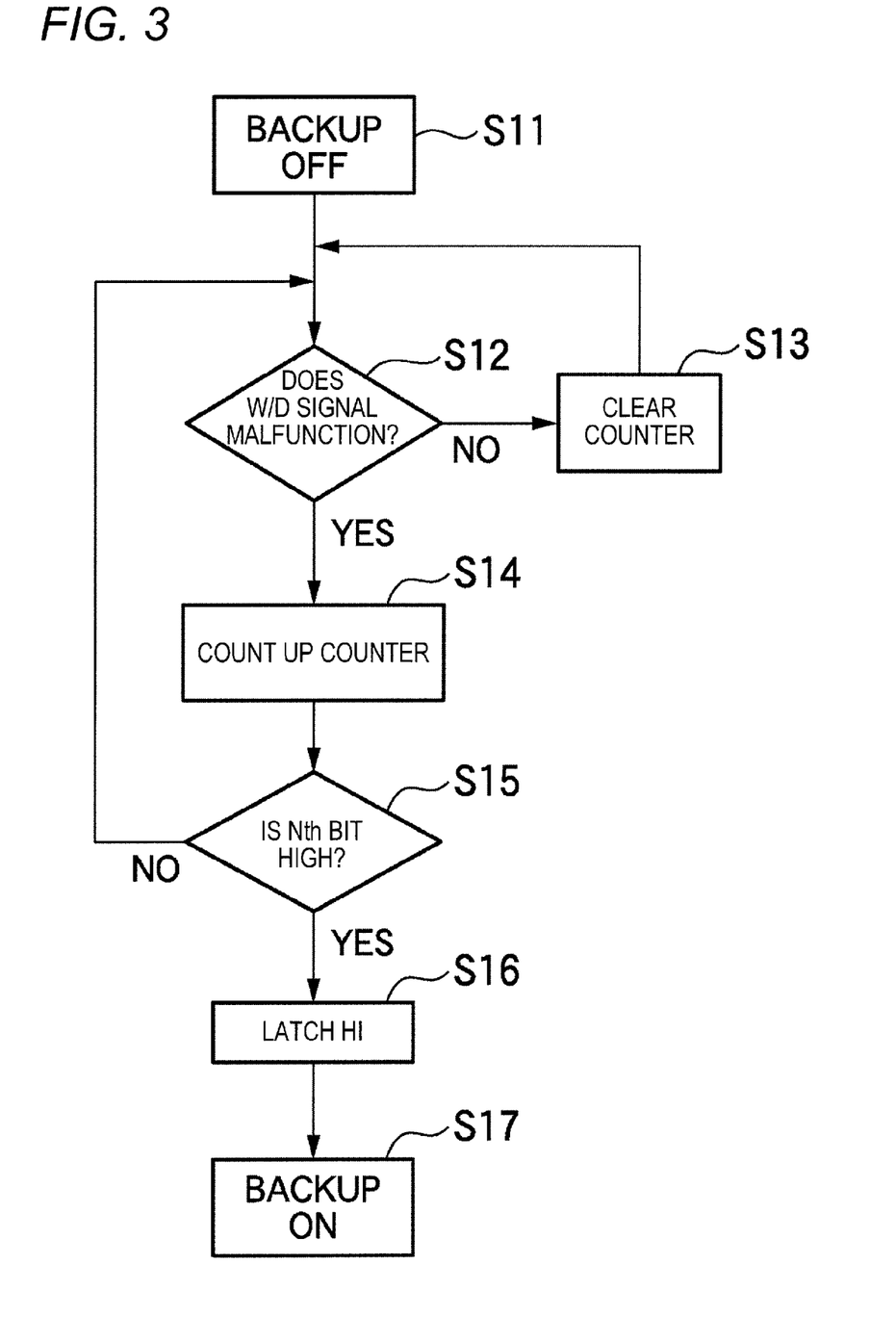
FIG. 3 is a flowchart illustrating an operation of the backup signal generation circuit illustrated in FIG. 1.

FIG. 2 illustrates timing of each signal with regard to an operation of the backup signal generation circuit 20 illustrated in FIG. 1, and FIG. 3 illustrates a sequence of the operation. Operations of the backup signal generation circuit 20 will be described with reference to FIG. 2 and FIG. 3.

In an initial state, the backup control signal SGB is deactivated (Lo level) (S11). That is, a state of the latch circuit 25 is reset.

As illustrated in FIG. 2, the clock pulse CK1 is constantly output. In addition, when the microcomputer 10 normally operates, the pulse periodically appears in the watchdog signal W/D, and if a malfunction occurs in the microcomputer 10, the pulse output of the watchdog signal W/D is suspended or stopped.

The counter 23 counts the clock pulse CK1 that is constantly input. However, if the clear control terminal CLR of the counter 23 goes to a high level (Hi) due to an occurrence of the pulse of the watchdog signal W/D, on all such occasions, the count state is cleared (S13) and returns to an initial state. Thus, when the watchdog signal W/D is normal, each of the count output terminals Q1, Q2, and Q3 of the counter 23 maintains a low level (Lo) state, as illustrated in FIG. 2.

Meanwhile, if the pulse output of the watchdog signal W/D is in a stop state, even in any case of Hi/Lo of the potential of the watchdog signal output port 12, the DC components are blocked by the capacitor C1, and furthermore the resistor R1 quickly discharges the charge stored in the capacitor C1 or the like, and thus a clear operation performed by the clear control terminal CLR is in a released state. Accordingly, the processing proceeds to step S13 from step S12 illustrated in FIG. 3.

That is, the counter 23 continues the count operation of the clock pulse CK1, and a count value is counted up according to the elapse of time. Thus, in a case in which a malfunction occurs in the microcomputer 10, as illustrated in FIG. 2, the levels of each of the count output terminals Q1, Q2, and Q3 of the counter 23 are changed. In addition, in the configuration shown in FIG. 1, since the latch circuit 25 monitors the counter output signal SGA output from the count output terminal Q3, when the count output terminal Q3 is changed from Lo to Hi (S15), the latch circuit 25 latches the Hi (S16), and switches the backup control signal SGB to Hi (S17).

Thus, in a case in which the microcomputer 10 malfunctions, the microcomputer 10 itself cannot control the energizing control signal SG2, but in this case, instead of that, the backup control signal SGB that is output from the backup signal generation circuit 20 controls the energizing control signal SG2, and thus it is possible to control an on-off of the load 31.

For example, even in a case in which an instantaneous interruption of the power supply occurs, a component (capacitor Cx in FIG. 4) with a relatively large capacitance for determining a time constant is not used, and thus it is possible to instantaneously clear the counted value of the counter 23, and to prevent a malfunction at the time of an instantaneous interruption illustrated in FIG. 6. In a method of clearing the counter 23 at the time of the instantaneous interruption, during initial processing of the microcomputer 10, the pulse may be output once to the watchdog signal output port 12, and the reset signal that is generated in a power supply circuit which is not illustrated may be provided to the counter 23.

In addition, in a case in which precision of the pulse period of the clock pulse CK1 is high, the variation during the time required from when the pulse output of the watchdog signal W/D is stopped until when the backup control signal SGB is started, almost does not occur. Thus, even in a case in which a product such as an electronic control device is mass-produced, it is not necessary to provide a large margin by taking an influence of the variation into account at the time of designing, and it is possible to start the backup control signal SGB in a short period of time after the pulse output of the watchdog signal W/D is stopped.

<Possibility of Modification>

In the configuration illustrated in FIG. 1, the latch circuit 25 monitors the counter output signal SGA that is output from the count output terminal Q3 of the counter 23, but may be changed so as to monitor a signal of any one of the count output terminals Q1 to Q3 as necessary. That is, it is assumed that the configuration can be appropriately changed in accordance with a difference between the pulse periods of the clock pulse CK1 that is output from the clock generator 24, or with the expectation value during the time required from when the pulse output of the watchdog signal W/D is stopped until when the backup control signal SGB is started.

In the configuration illustrated in FIG. 1, the backup signal generation circuit 20 includes the clock generator 24, but in an environment in which an external device (not illustrated) that can output a desired clock pulse can be connected to the backup signal generation circuit 20, it is not necessary that the clock generator 24 is embedded in the backup signal generation circuit 20.

In the configuration illustrated in FIG. 1, if the pulse output of the watchdog signal W/D is stopped, and the backup control signal SGB is active, the switching device 32 (e.g., FET: Field Effect Transistor) is switched on and thereby the load 31 is in a constant energizing state. However, for example, in a case in which the load 31 is also intended to be manually controlled, it can be assumed that the energizing control signal SG2 is controlled by a logical sum or a logical product of a signal that is changed depending on a predetermined operation switch and the backup control signal SGB.

Here, the aspects of the load-control backup signal generation circuit according to the embodiments of the present invention described above will be briefly summarized and respectively described in the following items (1) to (4).

(1) A load-control backup signal generation circuit which, in a case in which a malfunction occurs in a control processor (microcomputer 10) which operates according to a predetermined program, supplies a backup control signal (SGB) to a switch (switching device 32) of a load (31) connected to an output of the control processor, the load-control backup signal generation circuit including:

a watchdog input terminal (21) to which a watchdog signal (W/D) periodically output from the control processor is input;

a pulse count unit (counter 23) which counts a clock pulse (CK1) generated with a constant period and which controls a count state of the clock pulse according to a signal input to the watchdog input terminal; and a backup signal output unit (latch circuit 25) which generates the backup control signal when a count output of the pulse count unit satisfies a predetermined condition.

(2) The load-control backup signal generation circuit as described in the item (1), further including:

a DC-cut capacitor (capacitor C1) connected between the watchdog input terminal and a control input terminal of the pulse count unit; and a potential-control resistor (resistor R1) connected between the control input terminal (clear control terminal CLR) of the pulse count unit and a power supply line having a predetermined potential.

(3) The load-control backup signal generation circuit as described in the item (1) or (2), further including a clock pulse generator (clock generator 24) which generates the clock pulse (CK1) with the constant period.

(4) The load-control backup signal generation circuit as described in any one of the items (1) to (3), wherein the backup signal output unit retains a state of the generated backup control signal in the latch circuit (25), when the count output signal of the pulse count unit satisfies the predetermined condition.

What is claimed is:

1. A load-control backup signal generation circuit which, in a case in which a malfunction occurs in a control processor which operates according to a predetermined program, supplies a backup control signal to a switch of a load connected to an output of the control processor, said load-control backup signal generation circuit comprising:
 a watchdog input terminal to which a watchdog signal periodically output from the control processor is input;
 a pulse count unit which counts a clock pulse generated with a constant period and which controls a count state of the clock pulse according to a signal input to the watchdog input terminal; and
 a latch circuit comprising a D input terminal connected to a power supply line and a latch input connected to an output of the pulse count unit to receive an output signal of the pulse count unit, the latch circuit outputting the backup control signal based on the power supply line in response to the output signal latching the latch circuit.

2. The load-control backup signal generation circuit according to claim 1, further comprising:
 a DC-cut capacitor connected between the watchdog input terminal and a control input terminal of the pulse count unit; and
 a potential-control resistor connected between the control input terminal of the pulse count unit and a power supply line having a predetermined potential.

3. The load-control backup signal generation circuit according to claim 1, further comprising:
   a clock pulse generator which generates the clock pulse with the constant period.

4. The load-control backup signal generation circuit according to claim 1,
   wherein the pulse count unit retains a state of the generated backup control signal in the latch circuit, when the output signal of the pulse count unit latches the latch circuit.

5. A load-control backup signal generation circuit which, in a case in which a malfunction occurs in a control processor which operates according to a predetermined program, supplies a backup control signal to a switch of a load connected to an output of the control processor, said load-control backup signal generation circuit comprising:
   a watchdog input terminal to which a watchdog signal periodically output from the control processor is input; and
   a processor configured to:
   count a clock pulse generated with a constant period and which controls a count state of the clock pulse according to a signal input to the watchdog input terminal; and
   receive a count output at a clock input of a latch circuit and output a backup control signal based on a power supply at a D input of the latch circuit in response to the count output satisfying a predetermined condition.

\* \* \* \* \*